(12) United States Patent
Chapuis et al.

(10) Patent No.: US 6,704,203 B2
(45) Date of Patent: Mar. 9, 2004

(54) POWER SUPPLY MODULE

(75) Inventors: Alain Chapuis, Riedikon (CH); Peter Gammenthaler, Hittnau (CH)

(73) Assignee: Power-One A.G., Uster (CH)

( * ) Notice: Subject to any disclaimer, the term of this patent is extended or adjusted under 35 U.S.C. 154(b) by 0 days.

(21) Appl. No.: 10/060,621

(22) Filed: Jan. 30, 2002

(65) Prior Publication Data

US 2002/0118504 A1 Aug. 29, 2002

(51) Int. Cl.$^7$ .................................................. H05K 7/20
(52) U.S. Cl. ...................... 361/719; 165/80.3; 165/185; 361/704; 361/710; 361/715
(58) Field of Search ............................. 165/80.2, 80.3, 165/185; 174/163, 250, 261; 257/707, 712, 691, 775, 776; 361/704–705, 707–710, 714–721, 761, 763–764, 774–775, 777, 780, 796; 363/141–142, 144, 147

(56) References Cited

U.S. PATENT DOCUMENTS

| 5,424,579 | A | * | 6/1995 | Arai et al. ................... 257/690 |
| 5,659,462 | A | | 8/1997 | Chen et al. |
| 5,663,869 | A | * | 9/1997 | Vinciarelli et al. ......... 361/707 |
| 5,761,040 | A | * | 6/1998 | Iwasa et al. ................. 361/704 |
| 5,835,350 | A | * | 11/1998 | Stevens ....................... 361/704 |
| 6,111,310 | A | * | 8/2000 | Schultz ........................ 257/691 |
| 6,201,701 | B1 | * | 3/2001 | Linden et al. .............. 361/720 |

* cited by examiner

*Primary Examiner*—Gregory D. Thompson
(74) *Attorney, Agent, or Firm*—Carter Schnedler & Monteith

(57) ABSTRACT

The invention relates to a power supply module for high output currents, particularly a DC-DC converter, with a plate-shaped carrier element (10) configured to interact with a planar inductor and having a plurality of conductor layers, which has a suitably formed opening (12) to receive a core element of the planar inductor, on the component side is formed for automated mounting of electronic components (16), particularly a power semiconductor (14), and on the output side has a contact arrangement (40) to discharge the high output current. On the component side a strip- and/or rail-shaped bridge element (18) is provided, which forms a conductor for the output current and has a conductor cross section greater than 2 mm$^2$. The bridge element, as a component independent of the carrier element, is preferably mounted and contacted on the carrier element by means of an automated assembly process.

16 Claims, 2 Drawing Sheets

POWER SUPPLY MODULE

BACKGROUND OF THE INVENTION

The present invention relates to a power supply module, in particularly, to a synchronous type DC-DC converter.

In electronic consumers for such a power supply module, the tendency is toward increasingly lower supply voltages, particularly less than 3.3 volts (today, for example, DC supply voltages commonly range from 1.2 to 1.8 volts). Generic power supply modules generate such supply voltages stably and with low noise level from input voltages ranging from 40 to 60 volts.

Since the power requirement of high-performance processors continues to increase while their supply voltage simultaneously decreases (to obtain higher clock frequencies), the required operating currents increase more than proportionally. For supply voltages of 1.2 to 1.8 volts, the output currents to be generated by common power supply modules accordingly are in the range of 60 amperes and higher. This is true particularly in connection with so-called DPAs (Distributed Power Architectures).

Due to the given high current and power densities it has thus far been necessary to provide a plurality of DC-DC converters to master these demanding power supply problems. Besides the necessary production and circuit engineering complexity, this involves the additional disadvantage of comparatively large, voluminous enclosures for the power supply modules. This creates space problems particularly in tight application environments.

It is known in the art to use a printed circuit board with a plurality of conductor layers (a so-called multilayer board) to construct DC-DC converters. This multilayer board is equipped with corresponding power semiconductors and designed to receive cores for planar inductors through corresponding openings. To cool the inductors as well as the power semiconductors, a cooling element is associated with the multilayer board as the carrier element. This creates a comparatively compact, thermally and electrically suitable arrangement. Such a device is known, for example, from the applicant's German Application 197 40 283.6.

However, this known arrangement, too, has drawbacks in view of the continuously increasing current and power densities and an intended further increase in the packaging density (while decreasing the enclosure dimensions). For, due to the employed multilayer printed circuit board material, even with up to 12 individual conductor layers of a typical layer thickness of 100 micrometers, the physically realizable limit for a maximum output current to be produced is about 60 amperes. A further increase in the output current would require track conductor geometries that can no longer be reasonably implemented in conventional enclosure sizes or printed circuit board dimensions.

From the aforementioned generic state of the art it is furthermore known to use a cooling element (typically made of aluminum) to cool simultaneously a core of an inductor as well as a power semiconductor. However, particularly with a further increase in the component or packaging density of such a device, the heat dissipation known from DE 197 40 283.6 is also no longer sufficient.

Finally, the known converter devices have the problem that the high output current must also be reliably discharged. Existing pin or port connections are not sufficient, however, especially in view of simple (preferably automated) component mounting and production as well as in view of the amperages that are expected to be obtained.

All approaches are further characterized by the technological challenge of simplifying the process technology involved in manufacturing a known power supply module. The goal is to be able to use automated component mounting and soldering processes to the largest possible extent.

OBJECTS OF THE INVENTION

Thus one object of the present invention is to improve a generic power supply module both in view of further increasing the generated output current (with correspondingly lower output voltages) and to improve heat dissipation or cooling of the electronic components (and thus to create the conditions for further integration) and to expand the possibilities for reliably discharging high currents.

Another object of the present invention is to provide a power supply module which is better suited for automated production and thus cost reduction in the production process.

SUMMARY OF THE INVENTION

The bridge element provided, according to one form of the invention, advantageously allows an elegant solution from a production and functional point of view to the problem of high current density, particularly between the output-side contact arrangement and the synchronous power semiconductors. Particularly by specifying a suitable cross section of the preferably used copper material, it is possible to process the required high output currents without significant heating. At the same time the bridge element can be treated and processed like a normal device capable of being assembled and soldered in an automated production process (e.g., an SMD electronic component). This saves additional assembly and connection costs, and the device according to the invention, and thus the entire unit, can be automatically and efficiently produced by means of conventional component mounting and soldering equipment. The 1.5 mm$^2$ lower limit cross section indicated in the main claim should be understood only as an example. To be usable at all, a bridge element according to the invention, compared to a copper track conductor (typically 150 micrometers thick), must permit a certain improvement with respect to power dissipation, this in relation to a conductor length suitable for automatic component insertion, which is typically between 5 and 10 mm. The present invention, however, also covers particularly those conductor cross sections for the inventive bridge element, which based on other material parameters, permit a significant drop in the power dissipation (i.e. higher by a factor of at least 4 to 5).

Advantageously, thermal relief of the carrier element, which is typically designed as a multilayer board, is also provided, so that the requirements to be met by the employed material are reduced and additional savings may possibly be realized.

According to a preferred embodiment of the invention, the inventive bridge element is a SMD, i.e., it is mounted on the surface. A further development proposes to provide positioning projections in the form of positioning segments on the bridge element, which allow simpler and more precise placement of the element in the desired position on the component side of the carrier element.

Particularly preferably, the inventive bridge element is guided on the component side in the form of a long angled strip, such that the space (available in any case) between other electronic elements or inductive components on the carrier element can be used. This embodiment makes it possible, in particular, to guide the bridge element closely to the corresponding connecting branches of the synchronous power semiconductor so as to make contact and thereby reduce transfer resistances.

In addition, the recess in the bridge element, which is provided on the component side according to a further development, makes it possible effectively to prevent any risk of a short circuit or an unintended contact with a track conductor provided on the surface of the carrier element.

The present invention thus provides an unconventional, highly flexible, easy-to-mount and reliable solution to the dilemma of continuously increasing output currents and the requirement for increasingly compact devices in that the high current conductor on the output side is conceived as a component (capable of automated mounting and assembly) instead of using the track conductors, which are available in the multilayer board but are limited by the effective conductor cross section. The strip form of the bridge element, which can be given almost any shape by angles, permits a flexible use of gaps or free areas that exist in any case on the component side of the carrier element. This provides an elegant solution to the goal of a more compact structure with little heating (and this despite higher amperages).

In accordance with another form of the present invention, an improvement in the interaction between the cooling element and the electronic components on the component side of the carrier element is provided. This aspect of the invention provides, through suitable shaping of the corresponding surface of the cooling element by means of troughs provided according to the invention, to create a contour of the cooling element, which in thermally and electrically optimal manner follows the height of each mounted component which varies across the entire surface of the component side. With the use of a heat-conducting contact medium, this allows simple heat removal to the cooling element and, in addition, due to the trough shape, makes it possible to limit the application area or the effective application surface of the contact medium (i.e., the potting compound). "Selective potting" within the scope of the invention is thus defined as filling narrow junction zones (already simulated with respect to contour) between the cooling element on the one hand and the component or printed circuit board surface on the other hand. It does not extend over the entire surface of the carrier element or the cooling element but instead is limited to the actually relevant junction zones. This has an effect particularly on the consumption of the (costly) silicon-based potting compound or the like. A further advantageous effect is that there is no need for tight component or height tolerances of the mounted components—which in practice would be extremely difficult in any case. Rather, the potting compound elegantly absorbs said tolerances in the corresponding trough-shaped recess of the cooling element.

The scope of the present invention also provides for combining the first and second form of the invention set forth above so that, for example, a trough-shaped recess is provided particularly also for a bridge element, as will be described below with the aid of exemplary embodiments.

In accordance with another form of the present invention, the problem created particularly in view of the automated production of a contact element, which is suitable for the high output current, is solved. On the one hand, the contact element should interact simply and with high contact stability with a corresponding connecting component or printed circuit board of a downstream consumer (generally a large printed circuit board). On the other hand, it should nevertheless be capable of automated assembly and soldering without the risk of unsoldering the original connection, for example, during soldering of the consumer side printed circuit board element.

According to the invention this is advantageously solved on the one hand by a connection to a consumer-side printed circuit board via fingers of the inventive connector element. On the other hand said connector element is capable of automated mounting and soldering due to the flange segment.

Thus, a highly compact, powerful arrangement is created, which, in particular, meets the requirements of future low-voltage range consumers and combines maximum automated mounting and production capability with optimized thermal or heat dissipation properties. This form of the invention, too, can be combined with the above-described first and second forms of the invention (i.e. bridge element and trough-shaped indentations and partial potting). To this extent any combination of the features described below with the aid of exemplary embodiments is covered by the invention.

BRIEF DESCRIPTION OF THE DRAWINGS

Further advantages, features and details of the invention will now be described, by way of example, with reference to preferred embodiments and the drawings in which.

DESCRIPTION OF THE PREFERRED EMBODIMENTS

A multilayer type printed circuit board 10 (carrier element) is provided with otherwise known openings 12, in which magnetically effective cores are inserted to form planar inductors together with track conductor segments of the multilayer board 10.

The printed circuit board 10 is further equipped with electronic components, e.g., power semiconductors 14 and further passive components 16 (indicated only schematically) to realize a synchronous converter (with otherwise known circuit topology). Components 14, 16 can be mounted in automated assembly and soldering processes, e.g., SMD, in a manner known per se.

Figure 1:
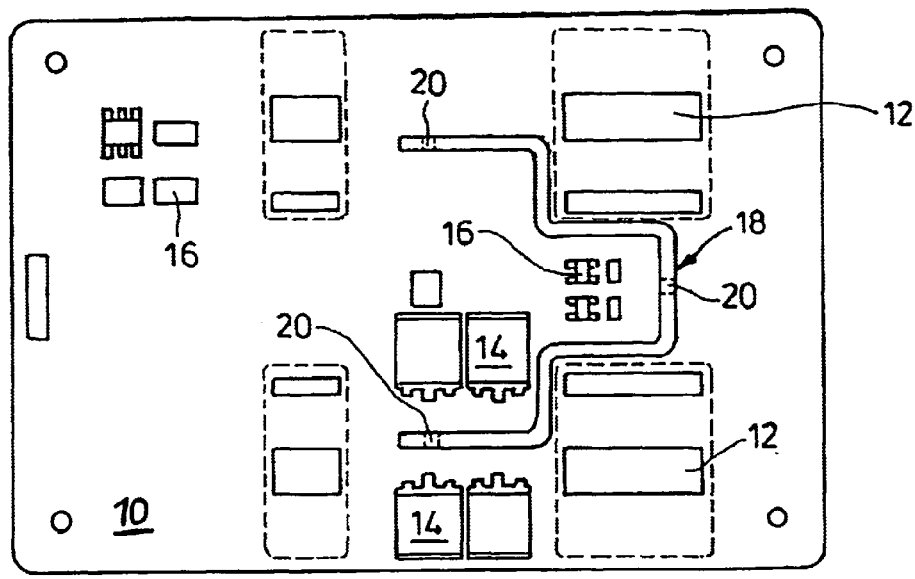
FIG. 1 is a schematic top view onto the component side of the multilayer carrier element according to a first preferred embodiment of the present invention, which in so far corresponds to best mode.

FIG. 1 further shows an electrically conductive bridge element in the form of a multiply angled bow-shaped element 18, which, suitably bent from a nickel-plated and then tin-plated copper strip, provides a track conductor from the synchronous power semiconductors 14 up to an output-side contact arrangement (not shown).

Figure 2:
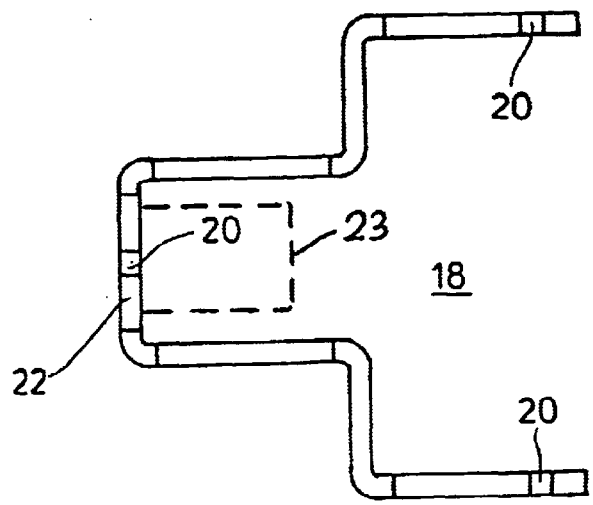
FIG. 2 is a top view onto the bridge element for use as an automatically mountable component in the embodiment according to FIG. 1.
Figure 3:
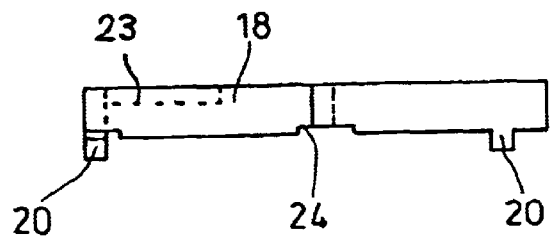
FIG. 3 is a side view of the bridge element according to FIG. 2.

More specifically, as may be seen particularly from FIGS. 2 and 3, the bridge element 18 is made of a material approximately 2 mm thick and 4 mm high (in relation to the component surface of the printed circuit board 10). This results in an effective rectangular cross-sectional area of approximately 8 mm² for an output side current of typically 100 A.

The side view of FIG. 3 further illustrates that on the underside (i.e., in the direction of the printed circuit board 10) positioning projections 20 protrude in a center area 22 of the bridge element as well as on the end face. In the positions schematically shown in FIG. 1, they engage with the suitably associated indentations in the printed circuit board 10 for proper positioning. In the embodiment shown, these positioning projections 20 are not used for actual fixation, however. Fixation is instead effected by an otherwise known surface soldering process, which is known from SMD production processes.

As FIG. 1 further illustrates, the bridge element 18 is guided in meander or bow-shape across the component side surface of the printed circuit board 10 such that existing gaps between mounted components are used effectively and practically no additional space is required on the surface.

The side view of FIG. 3 illustrates a bottom side recess 24, which in the assembled state ensures that there is no undesired contact with the track conductors (not shown in FIG. 1) on the surface of the multilayer printed circuit board 10.

A further preferred embodiment of the invention is schematically shown in FIGS. 2 and 3 and provided with reference number 23. A preferably one-piece flange segment 23 fitting against the center area 22 of the bridge element 18 and forming a flat surface is intended to be received by a (typically pneumatic) pick-and-place machine and thus facilitates automated positioning or assembly of the bridge element 18 as well. For engagement with the pick-and-place machine it is particularly advantageous if the flange segment 23 forms a flat upper surface, which in the mounted state of the bridge element extends parallel to the component surface of the carrier element 10.

Figure 4:
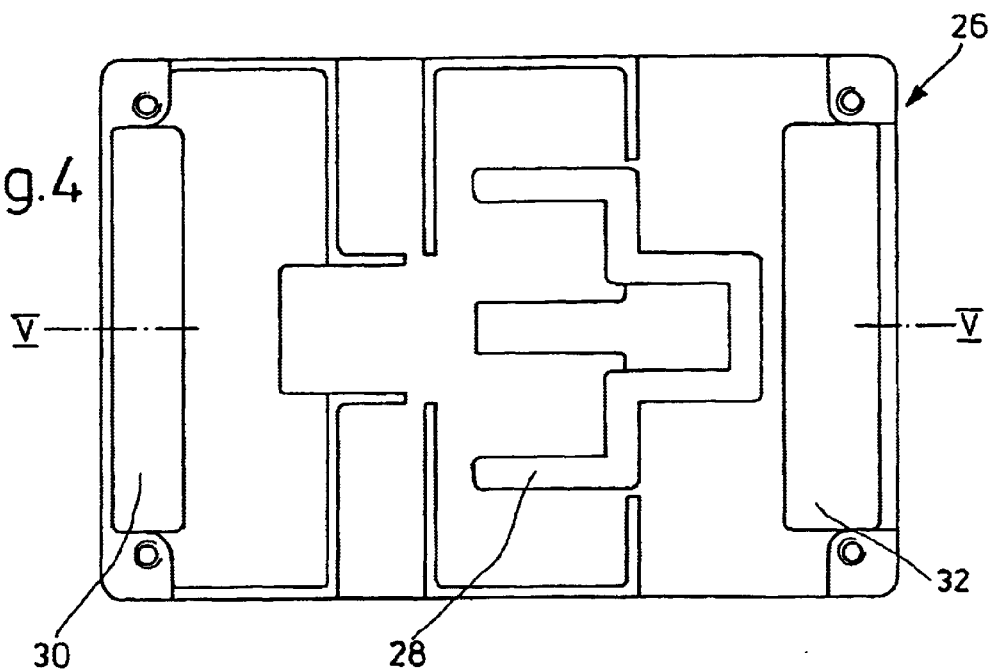
FIG. 4 is a top view onto the contact area of a cooling element for interaction with the multilayer carrier element according to FIG. 1.
Figure 5:
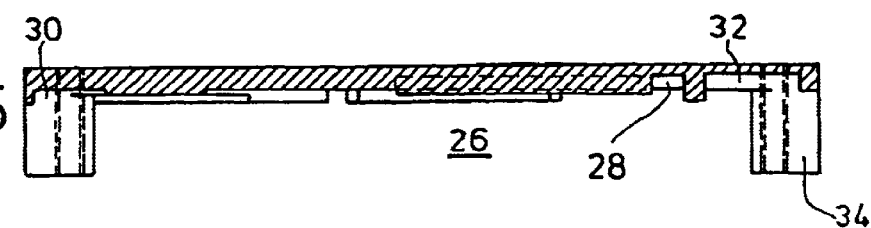
FIG. 5 is a sectional view corresponding to section line V—V in FIG. 4.

FIGS. 4 and 5 illustrate how, corresponding to the structure or height contour of the assembled printed circuit board 10, an associated cooling element 26 made of suitably shaped (milled or cast) aluminum is provided with indentations in the form of troughs that largely follow the variable surface contour of the component side of the printed circuit board 10. The trough-shaped recesses in the cooling element 26, (see, for example a recess 28 duplicating the shape of the bridge element 18, or left or right side troughs 30, 32 for elements in the border area of the printed circuit board that are not shown in FIG. 1) are dimensioned with respect to an effective depth so as to respond flexibly by tolerances to deviations in the assembly height (which cannot be completely avoided even in automated production processes). This is made possible in that the corresponding troughs or recesses are selectively filled with a potting compound and accordingly provide reliable heat transfer from each partner element that is to be cooled.

The term "trough" is not limited to completely enclosed regions. As may be seen particularly in the top view onto the contours according to FIG. 4, it also includes largely or partially enclosed surface regions, which are then selectively provided with potting compound for associated electronic components. As FIG. 5 further illustrates, spacers 34 integrally fitting into the corners of the cooling element 26 are provided for assembly with other components or the printed circuit board 10.

Figure 6:
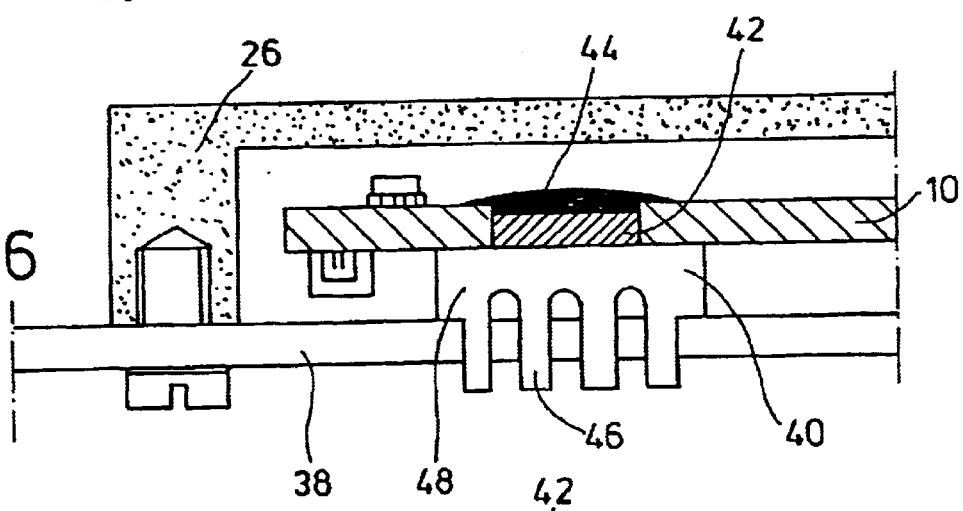
FIG. 6 is a schematic sectional view to illustrate the output side contact arrangement according to a further embodiment of the present invention.
Figure 7:
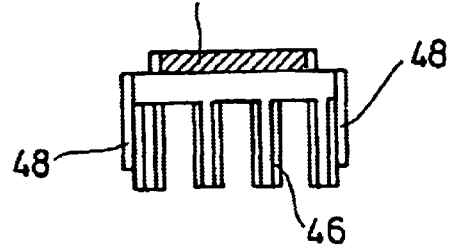
FIG. 7 is a detail view of the one-piece or integral connector element for use in the arrangement according to FIG. 6.

With reference to FIGS. 6 and 7, an embodiment will now be described which illustrates a possibility for discharging the high output current to a printed circuit board 38 of an associated consumer in a manner that is particularly advantageous from a production engineering point of view.

More specifically, a ridge or fork-shaped connector element 40 (shown in detail in FIG. 7) is anchored for this purpose in the printed circuit board 10 by reflow soldering. At its end associated with printed circuit board 10 it is provided with a flange segment 42 intended to interact with a corresponding oblong hole and provided for the automated soldering process. This flange segment 42 further has a slightly corrugated outside surface to provide a good hold in the printed circuit board (reference number 44 denotes the automatically applied solder).

On the opposite end, the connector element 40 has four fingers 46, which engage with suitable openings in the consumer printed circuit board 38 where they can be fixed by suitable, preferably automated soldering processes. Alternatively, the connector element can have fingers or fork-shaped projections on both sides. In this case the printed circuit board 10, instead of the oblong hole, would have a plurality of corresponding (round) holes for a plurality of fingers.

Particularly preferably, the connector element 40 is a stamping that is made of copper sheet or the like and is subsequently nickel- or tin-plated. Fingers 46, at least on their end face, are advantageously rounded or nearly rounded to engage with corresponding bores in the consumer printed circuit board 38. It may also be seen how end face projections or thickenings on fingers 46 offer an effective stop or abutment for the consumer printed circuit board 38.

In addition to its advantageous conductance for high output currents, the arrangement shown has the advantage that it is capable of being mounted simply and economically on printed circuit board 10 by automated assembly and soldering processes. On the other hand, however, the inventive fork or ridge shape ensures that subsequent soldering processes on finger ends 46 (unlike in a continuous strip-shaped contact element) do not cause a possible detachment of soldered connection 44 but leave it unaffected, without influence on the contact quality.

This measure thus makes it possible to reach the goal of a compact converter unit that can be produced economically in an automated production process and is suitable for the highest amperages. Thus, the present invention, in ways heretofore unknown, offers possibilities for further reducing the volume of power supply modules, which are the subject of the invention.

Whereas the present invention has been described primarily by means of the example of a DC-DC converter, the aspects of the invention are not limited to such an arrangement. Rather, the present invention is suitable for any power supply modules that require a reliable and simple production solution for high output-side or input-side currents.

The invention is set forth in the appended claims. Any combination of claim features is claimed to be within the scope of the invention, irrespective of whether they actually refer back to the present claims. Thus, in particular, feature combinations of dependent claims with others than the immediately associated independent claims are to be viewed as falling within the scope of the invention.

From the foregoing description of the preferred embodiments of the invention, it will be apparent that many modifications may be made therein. It should be understood, however, that this embodiment of the invention is an exemplification of the invention only and that the invention is not limited thereto. It is to be understood, therefore, that it is intended in the appended claims to cover all modifications as fall within the true spirit and scope of the invention.

What is claimed is:

1. A power supply module for high output currents, particularly a DC-DC converter, with a plate-shaped carrier element (10) configured to interact with a planar inductor end having a plurality of conductive layers, which has a suitably formed opening (12) to receive a core element of the planar inductor, said plate-shaped carrier element (10) having a component side; said component side having been formed to enable automated mounting of electronic components (16), particularly a power semiconductor (14), and on the output side has a contact arrangement (40) to discharge the high output current, characterized in that on the component side, a bridge element (18) is provided, which forms a conductor for the output current and has a conductor cross section greater than 1.5 mm² so that the bridge element, as a component independent of the carrier element, can be mounted and contacted on the carrier element by an automated assembly process; the bridge element on the contact side has a recess (24), which is formed such that the bridge element in its mounted state does not contact a track conductor segment of a top side conductor lever of the carrier element extending in the region of the recess.

2. A power supply module as claimed in claim 1, characterized in that the conductor cross section is greater than 2 mm².

3. A power supply module as claimed in claim 1, characterized In that the bridge element is made of nickel-plated zinc-plated, or a combination of nickel-plated and zinc-plated copper material and has a substentially rectangular conductor cross section that extends perpendicularly to the component side.

4. A Power supply module as claimed in claimed 1, characterized in that the bridge element, on a side facing the carrier element, has at least one projection type positioning segment (20) configured to interact with, corresponding recess formed in a said component surface of the carrier element.

5. A power supply module as claimed in claim 1, characterized in that the bridge element has a surface segment and/or flange segment (23) which in the mounted state on the carrier element extends parallel to the carrier element and is dimensioned and shaped to interact and/or engage with a pick-and-place machine for the automated assembly process.

6. A power supply module as claimed in claim 1, characterized in that the power supply module is a synchronous rectifier and the bridge element is designed to connect a synchronous power semiconductor (14) with a connector element as the contacting arrangement.

7. A power supply module as claimed in claim 1, characterized in that the bridge element is designed for an output current greater than 80 amperes and has a conductor cross section greater then 4 mm².

8. A power supply module as claimed in claim 7, characterized in that the bridge element is designed for an output current greater than 80 amperes.

9. A power supply module as claimed in claim 1, characterized in that the bridge element is angled in a plane determined by the carrier element.

10. A power supply module as claimed in claim 9, characterized in that the bridge element has a plurality of substantially rectangular angles.

11. A power supply module for high output currents particularly DC-DC converter, with a plate-shaped carrier element (10) configured to interact with a planar inductor and having a plurality of conductor layers, which has a suitably formed opening (12) to receive a core element of the planar inductor; said plate-shaped carrier element (10) having a component side; said component side is having been formed to enable automated mounting of electronic components (16), particularly a power semiconductor (14), and on the output side has a contact arrangement (40) to discharge the high output current, characterized in that the contact arrangement has arm integrally formed fork-shaped connector element (40), which at one end has a plurality of finger segments (40) connected by a bridge segment (48) to interact with a downstream consumer unit, and at the other end has a flange segment (42), which fits against the bridge segment and is formed for automated soldering of the connector element to the carrier element by reflow soldering.

12. A power supply module as claimed in claim 11, characterized in that the finger segments have a rectangular conductor cross section, which forms a round or polygonal shape at the end face.

13. A power supply module as claimed in claim 11, characterized in that at least one end face of the finger segments has a thickening that forms a stop for a contacting printed circuit board element.

14. A power supply module as claimed in claim 11, characterized in that, on the component side, a bridge element (18) provided, which forms a conductor for the output current and has a conductor cross section greater than 1.5 mm so that the bridge element, as a component independent of the carrier element, can be mounted and contacted on the carrier element by means of a prefeably automated assembly process.

15. A power supply module as claimed in claim 14, characterized in that the conductor cross section is greater than 2 mm².

16. A power supply module as claimed in claim 11, characterized in that the canter element is configured to interact with a plate-shaped cooling element (26) such that the cooling element enable the cooling of the core element of the planar inductor as well as an electronic component provided on the component side, and the cooling element on its side facing the carrier element has a plurality of trough-shaped indentations (28, 30, 32) integrally incorporated or formed in the cooling element material, which simulates contour on the component side of the carrier element with mounted electric components and permits selective potting in the region of the trough-shaped indentation with a heat-conducting potting compound.

* * * * *